United States Patent [19]
Chung et al.

[11] Patent Number: 5,668,030
[45] Date of Patent: *Sep. 16, 1997

[54] PROCESS FOR MAKING IDENTIFICATION ALPHANUMERIC CODE MARKINGS FOR MASK ROM DEVICES

[75] Inventors: Chen-Hui Chung, Hsinchu Hsien; Kuan-Cheng Su, Taipei; Yi-Chung Sheng, Taichung, all of Taiwan

[73] Assignee: United Microelectronics Corporation, Hsinchu, Taiwan

[ * ] Notice: The term of this patent shall not extend beyond the expiration date of Pat. No. 5,576,236.

[21] Appl. No.: 524,549

[22] Filed: Sep. 7, 1995

[51] Int. Cl.$^6$ ............................... H01L 21/8246
[52] U.S. Cl. ............................... 438/401; 438/587
[58] Field of Search ............................... 437/48, 52, 924

[56] References Cited

U.S. PATENT DOCUMENTS 4,364,167 12/1982 Donley ............................... 257/391
5,051,374 9/1991 Kagawa et al. ............................... 437/8

*Primary Examiner*—Jey Tsai
*Attorney, Agent, or Firm*—Fish & Richardson, P.C.

[57] ABSTRACT

A process for fabricating identification alphanumeric code markings on the substrate of mask ROM devices is disclosed. The fabrication process comprises first forming a deposited layer on the substrate of the mask ROM device. A photoresist layer is then formed on the deposited layer. A photomask layer by is then shaped by forming a pattern on the photoresist layer that reveals the channel regions of the memory cell transistors to be programmed into the blocking state, as well as reveals the graphical pattern of the alphanumeric code marking. An etching procedure then removes the portion of the deposited layer revealing the graphical pattern of the alphanumeric code markings. The photomask layer is then removed. A code implantation procedure may precede or follow the etching procedure to facilitate the programming of the memory cells of the mask ROM device.

8 Claims, 12 Drawing Sheets

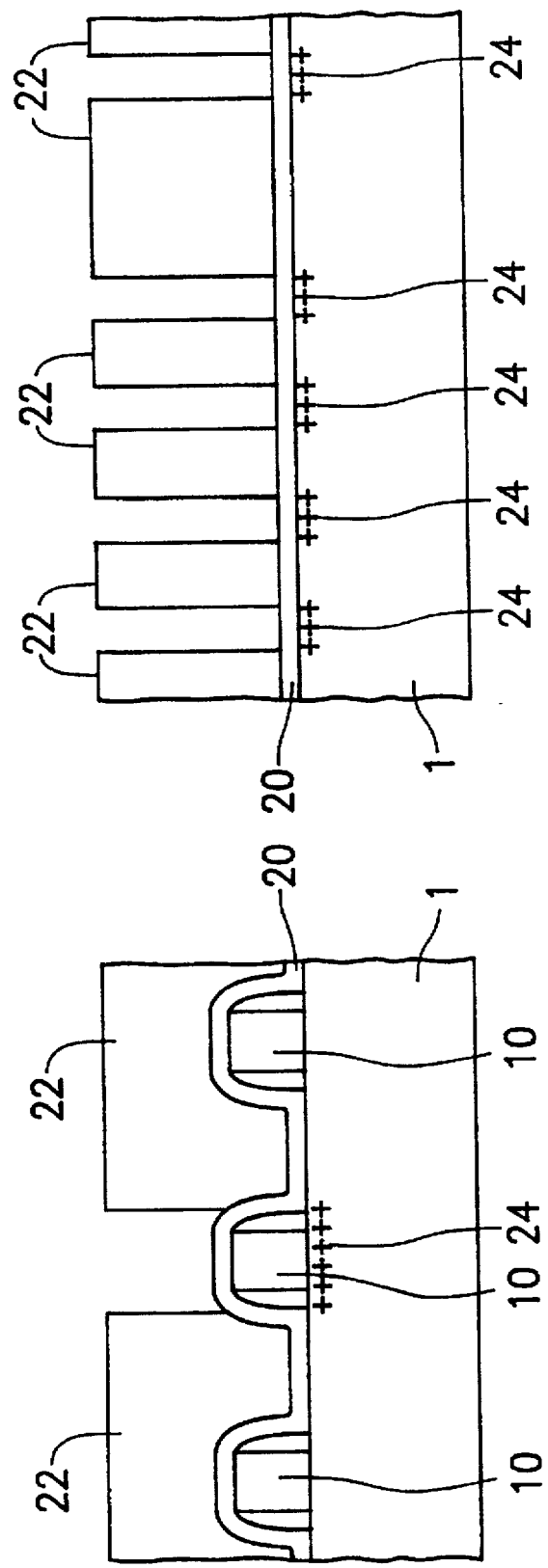

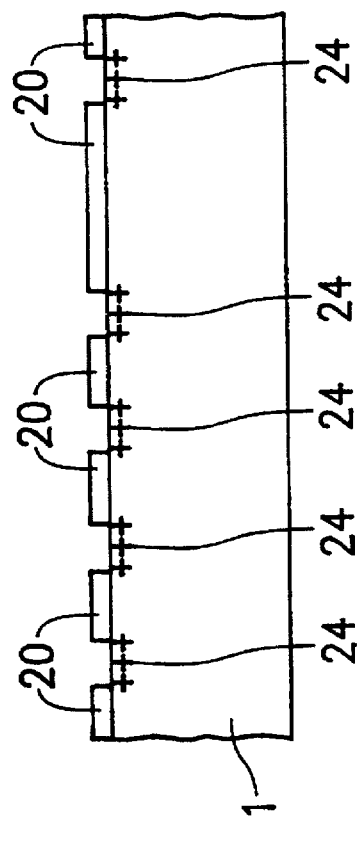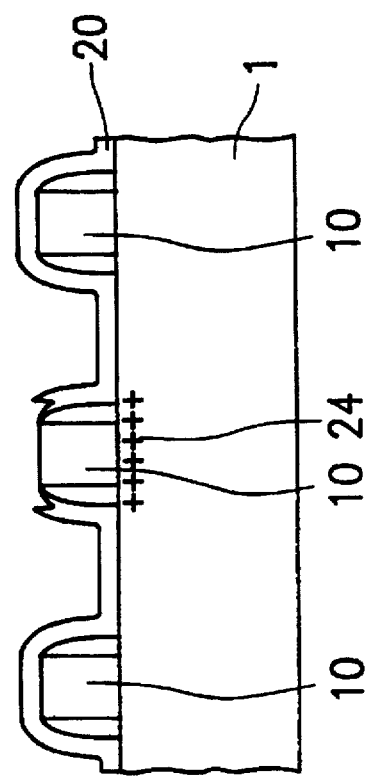
FIG. 8b
FIG. 8a

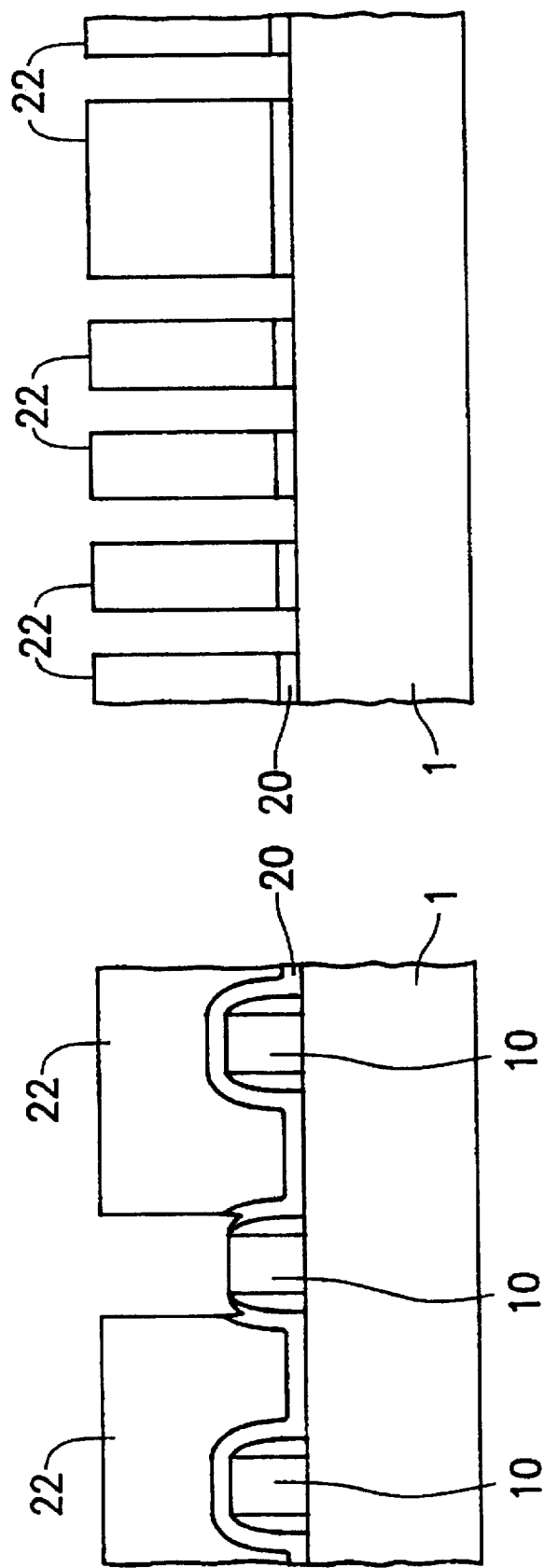

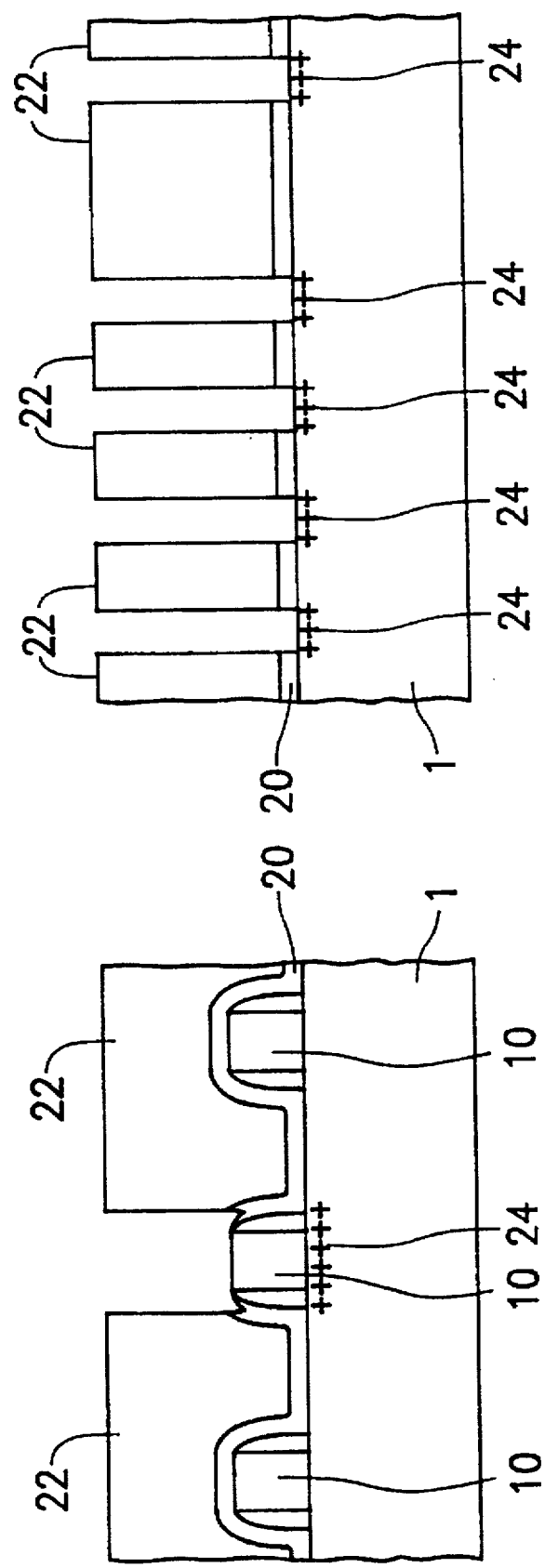

PROCESS FOR MAKING IDENTIFICATION ALPHANUMERIC CODE MARKINGS FOR MASK ROM DEVICES

BACKGROUND OF THE INVENTION

1. Field of the Invention

The present invention relates in general to a process for making identification alphanumeric markings on mask ROM devices. In particular, the present invention relates to a process for making identification alphanumeric markings on mask ROM devices using a patterned deposited layer in place of a photomask in the process of mask ROM fabrication so as to reduce fabrication costs.

2. Technical Background

Mask read-only memory (ROM) devices are semiconductor memory devices widely used in various digital systems. One of their primary applications is for use as the memory for holding program code and data for microprocessors in digital computer systems. FIG. 1a of the accompanying drawing of the present invention shows the top view of the device area of a typical mask ROM device.

Such a typical mask ROM device of FIG. 1a is constructed over a semiconductor silicon substrate implanted with, for example, P-type impurities. Defined N-type impurity implantation regions in the substrate define the bit lines B/L 3 for the memory cell array of the mask ROM device, which also serve as the source/drain regions for the memory cell transistors. These bit lines B/L 3 are generally parallel configurations formed as long strips as indicated in the drawing. Word lines W/L 4 comprising a gate oxide layer and a conducting layer form another set of parallel configurations that are perpendicular to the parallel configurations of the bit lines B/L 3.

Each region in the substrate that is between two consecutive bit lines B/L 3 below a word line W/L 4 may comprise the channel region 5 for the memory cell transistor of the mask ROM device. The selection of the status of either conduction or blocking of the channel region of a memory cell transistor determines the memory cell data content of either a binary zero or one, or vice versa, depending on the accompanying data sense amplifier (not shown) of the mask ROM device. To bring a channel region of a memory cell transistor into its electrically blocking state, P-type impurities may be implanted into the region. This selective P-implantation is referred to as the code implantation for the mask ROM device. The code implant in the selected transistor channel regions results in an increase of the threshold voltage that blocks the conduction of the transistor channel regions to turn them off.

Most mask ROM manufacturers add visually identifiable alphanumeric markings to the device substrate that contain identification codes for distinguishing the mask ROM substrate from others. This identification code is added to the code mask that contains the selection of the transistor cells to be programmed as blocking, and is made onto the device substrate when the device is factory-programmed. FIG. 1b of the drawing shows the top view of an example of the numeric marking 6, namely the code "007" on the substrate of a mask ROM device.

FIGS. 2 to 4 are the cross-sectional views of the memory device and the alphanumeric markings of the memory cell unit of a mask ROM device selected from the procedural stages in a conventional process of fabrication. FIGS. 2a, 3a and 4a are the cross sections of the memory cell transistor taken along the AA' line in the top view of the typical mask ROM device of FIG. 1a. On the other hand, FIGS. 2b, 3b and 4b are the cross sections of the alphanumeric markings taken along the BB' line in the top view of the "007" marking of the same mask ROM device of FIG. 1b.

To facilitate the program code implantation, as well as the making of the alphanumeric identification markings, the substrate 1 containing the mask ROM memory cells has a photomask layer 14 formed over the surface. The photomask layer 14 reveals the channel regions, as shown in FIG. 2a, for those memory cell transistors to be programmed into the blocking state that are underneath the gate configuration 10. The photomask 14 also reveals the pattern "007" to be marked over the suitable identifying region over the surface of the substrate 1, as is schematically shown in FIG. 2b. The code implanting ion implantation procedure may than be implemented to implant impurities, that is, the code implant 12 into those channel regions revealed. Note that the revealed regions of the pattern of the alphanumeric code marking are also subjected to the ion implantation, carrying additional code implants 12 that are functionless in these patterns.

Then in the process stage of FIG. 3, another photomask layer 16 is again formed to cover those channel regions exposed by the first photomask layer 14, but leaving the pattern for the code marking uncovered, as is shown in FIGS. 3a and 3b respectively. An etching procedure may then proceed to remove a thickness of the substrate 1 along the definition of the code marking pattern. This forms the recessed grooves 18 that shape the code marking "007" in this example.

Finally, in FIG. 4, the two successive photomask layers 14 and 16 are then removed, before the subsequent post process steps of covering BPSG and reflowing, as well as wiring may be implemented. In this prior art example, the alphanumeric code markings are "carved" into the substrate 1 of the mask ROM device.

Such a conventional process of fabricating the alphanumeric code marking, however, involves the use of multiple photomask layers. The code marking requires two photoresist applications, two photo exposures, as well as one etching procedure. The implementation of the second photomask layer, namely photomask layer 16 in the above example, is solely for the purpose of protecting the device area of the mask ROM device when the code marking is being fabricated.

SUMMARY OF THE INVENTION

It is therefore an object of the present invention to provide a process for fabricating alphanumeric code markings for mask ROM devices that has simplified procedure steps.

It is another object of the present invention to provide a process for fabricating alphanumeric code markings for mask ROM devices that involves minimal procedural steps and the code implantation process steps for the mask ROM itself.

The present invention achieves the above-identified objects by providing a process for fabricating identification alphanumeric code markings on the substrate of mask ROM devices. The fabrication process comprises first forming a deposited layer on the substrate of the mask ROM device. A photoresist layer is then formed on the deposited layer. A photomask layer is then shaped by forming a pattern in the photoresist layer that reveals the channel regions of the memory cell transistors to be programmed into the blocking state, as well as reveals the graphical pattern of the alphanumeric code marking. An etching procedure then removes the portion of the deposited layer revealing the graphical pattern of the alphanumeric code markings. The photomask layer is then removed. A code implantation procedure may precede or follow the etching procedure to facilitate the programming of the memory cells of the mask ROM device.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which:

FIGS. 5a–5b, 6a–6b, 7a–7b and 8a–8b are the cross-sectional views of the memory device and the alphanumeric markings of the memory cell unit of a mask ROM device, as selected from the procedural stages in the process of fabrication in accordance with a first preferred embodiment of the present invention; and FIGS. 9a–9b, 10a–10b, 11a–11b and 12a–12b are the cross-sectional views of the memory device and the alphanumeric markings of the memory cell unit of a mask ROM device, as selected from the procedural stages in the process of fabrication in accordance with a second preferred embodiment of the present invention.

During the description of the process of the present invention for the making of the alphanumeric markings, cross-sectional views taken along the AA' line in the device area of the typical mask ROM device of FIG. 1a, as well as the cross-sectional views taken along the BB' line in the numeric marking of FIG. 1b are selected from the process stages of its fabrication for the description. In other words, FIGS. 2a–12a are the cross sections of the memory device, while FIGS. 2b–12b are the cross sections of the alphanumeric markings.

DETAILED DESCRIPTION OF THE PREFERRED EMBODIMENT

Figures 1A, 1B:
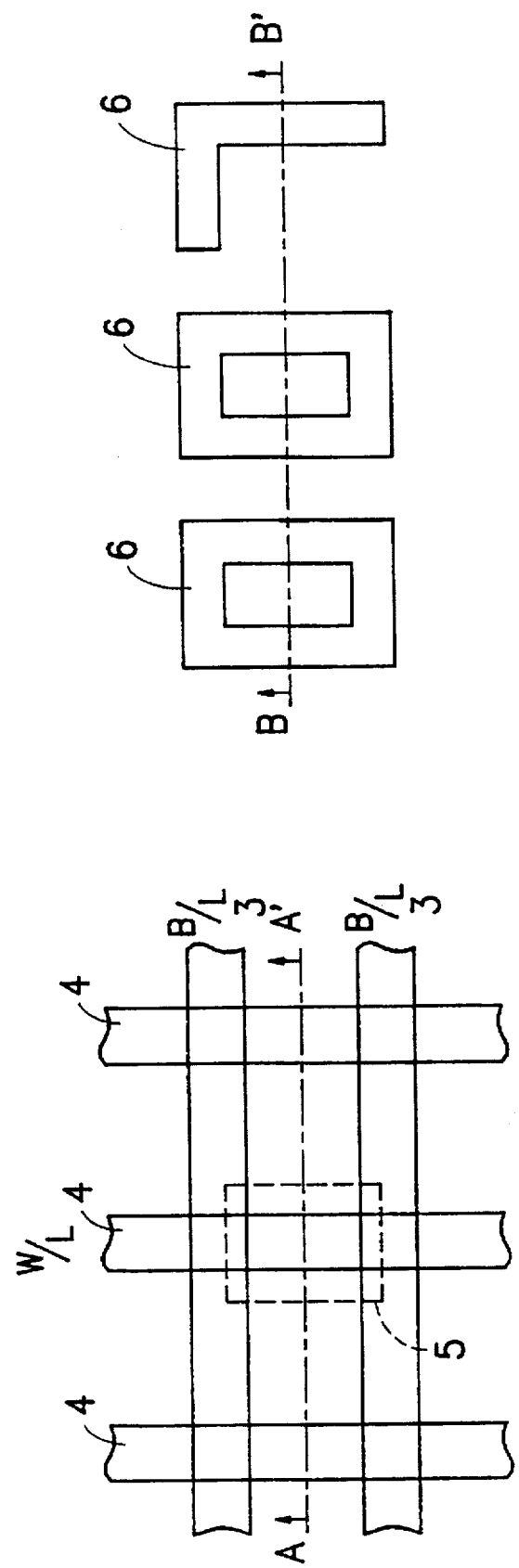
FIGS. 1a and 1b are the top views of the device area and the identification alphanumeric area of a typical mask ROM device.
Figure 2B:
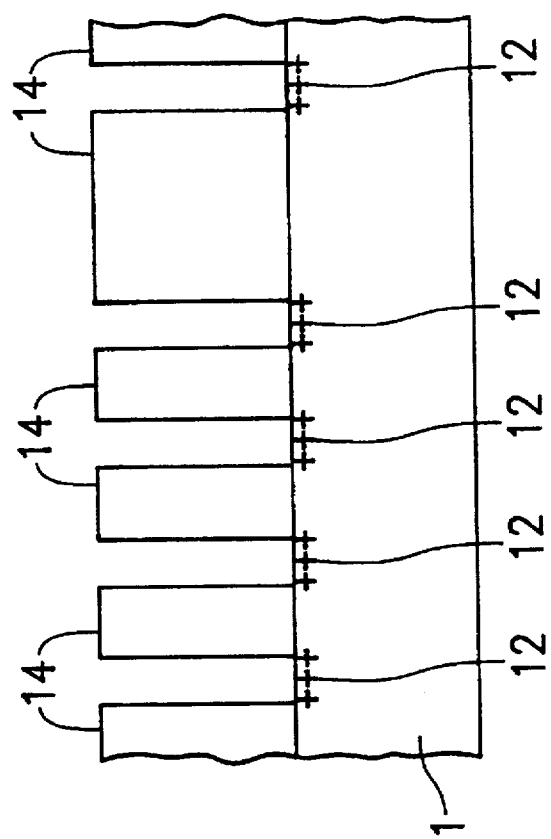
FIGS. 2a–2b, 3a–3b and 4a–4b are the cross-sectional views of the memory device and the alphanumeric markings of the memory cell unit of a mask ROM device selected from the procedural stages in a conventional process of fabrication.
Figure 2A:
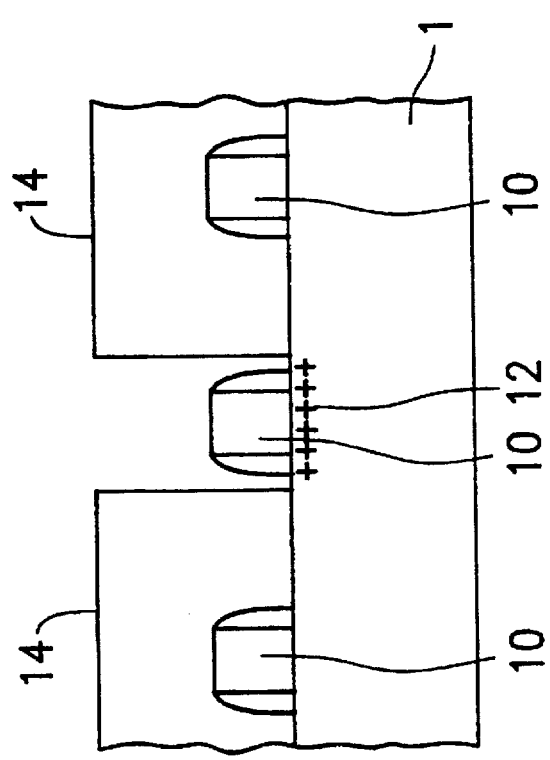
Figure 3B:
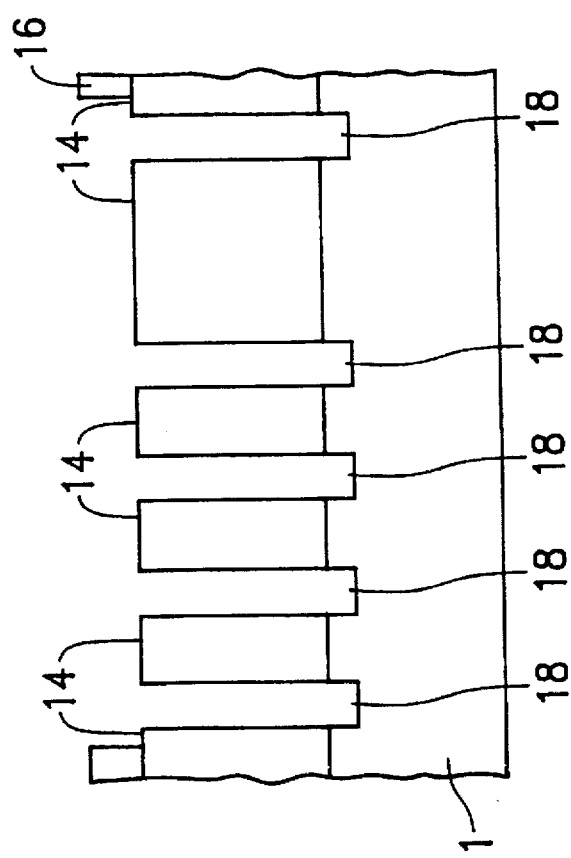
Figure 3A:
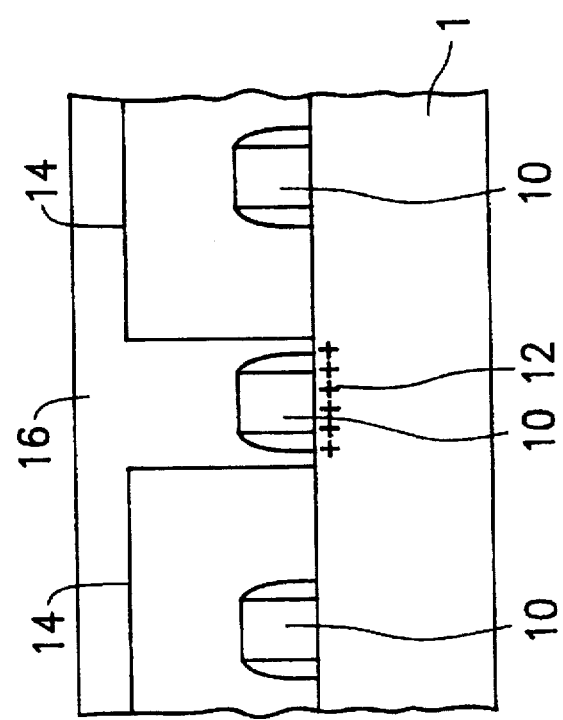
Figures 4A, 4B:
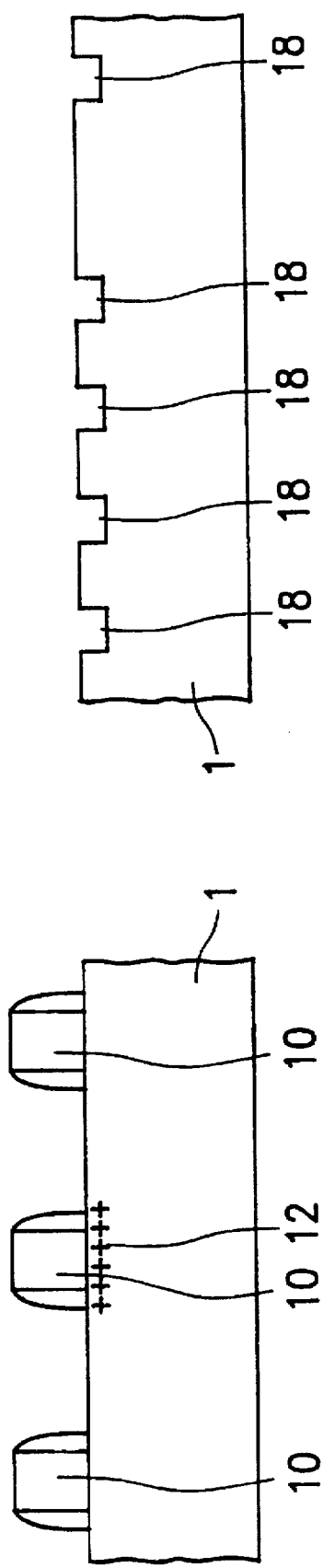
Figure 5B:
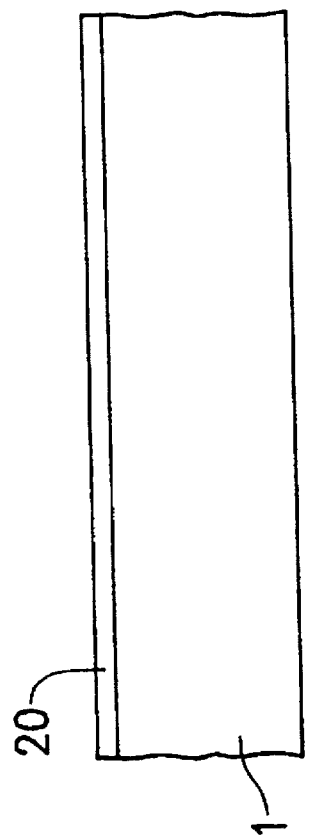
Figure 5A:
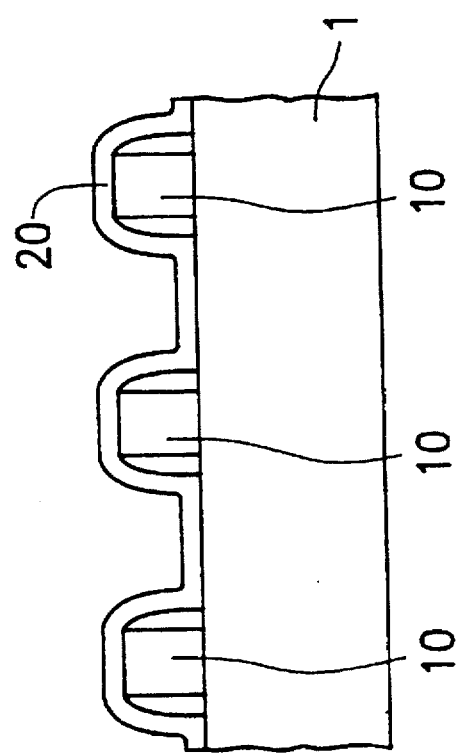

For a description of the process of the present invention, two preferred embodiments are exemplified below. Refer to FIGS. 5 to 8 for the first embodiment. A semiconductor substrate 1 is provided for the fabrication of the transistor memory cells that comprises the gate configuration 10 as shown in the cross-sectional view of FIG. 5a. As is well known in the art, this gate configuration 10 also comprises the word line W/L for the memory cells in the mask ROM device. A chemical vapor deposition (CVD) procedure such as, for example, atmospheric pressure CVD which requires a simple reactor to implement, may be employed to form a deposited layer 20 that covers the entire surface of the substrate 1, including both the device area for the memory cell units and the regions where the alphanumeric code markings are to be made. It should be noticed that depositing procedures other than the atmospheric pressure CVD may be employed. For example, low pressure CVD, liquid phase deposition, or other measures to form a nitride deposition layer may be feasible. The thickness of the deposited layer 20 should be controlled to within the range of about 200–2,000 angstroms.

Then, in FIG. 6, a photomasking layer 22 that contains both the pattern for the code implant procedure and the alphanumeric code marking may be formed to cover the surface of the substrate 1 at this stage. This photomasking layer 22 contains the revelation of the channel regions of the memory cell transistors to be programmed into the blocking state, as well as the graphical pattern of the alphanumeric code markings. The code implant procedure may then be implemented to implant the impurities 24 into the channel regions of the selected memory cell transistors underneath the gate configuration 10, as well as into the pattern of the code markings.

For the MOS memory cell transistors of the mask ROM device, P-type impurities such as boron, may be used as the code implant to bring the transistor programmed into the blocking state. When boron is used as the implanted material, the implantation concentration is controlled to be about $10^{13}$ to $10^{15}$ ions/cm$^2$ under an implantation energy level of about 10–200 KeV. To prevent over-dopping of both the implantation energy level and the resultant concentration, the thickness of the deposited layer 20 should not be excessive, rather, should be controlled to somewhere between 200 and 2,000 angstroms as described above.

Figures 7A, 7B:
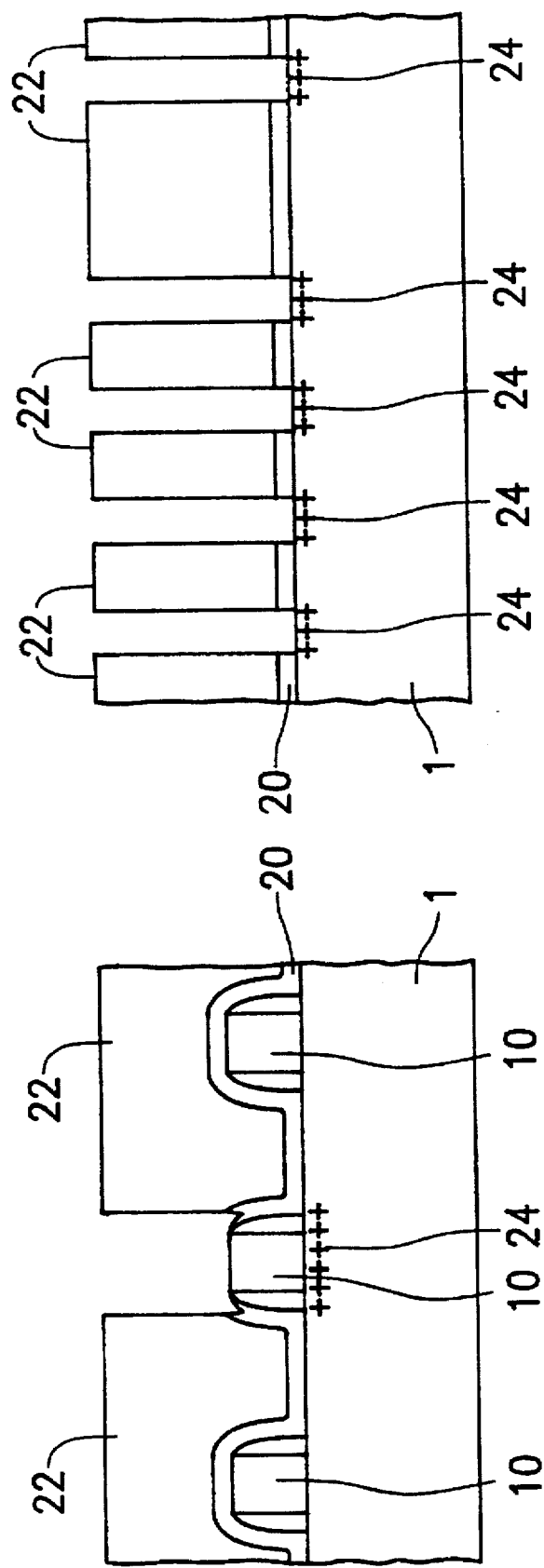
Figure 9B:
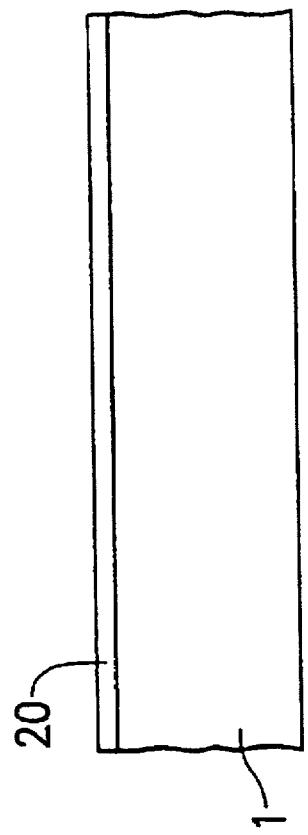
Figure 9A:
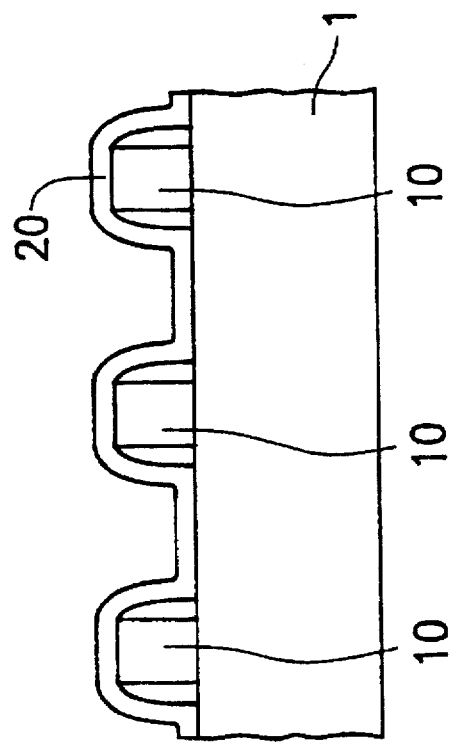
Figure 12A:
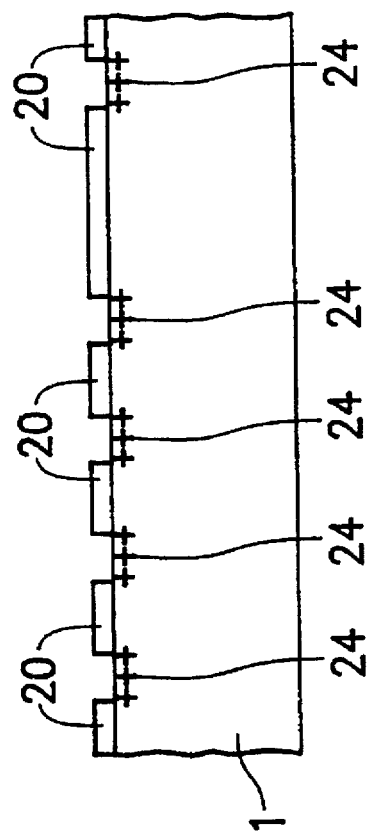
Figure 12B:
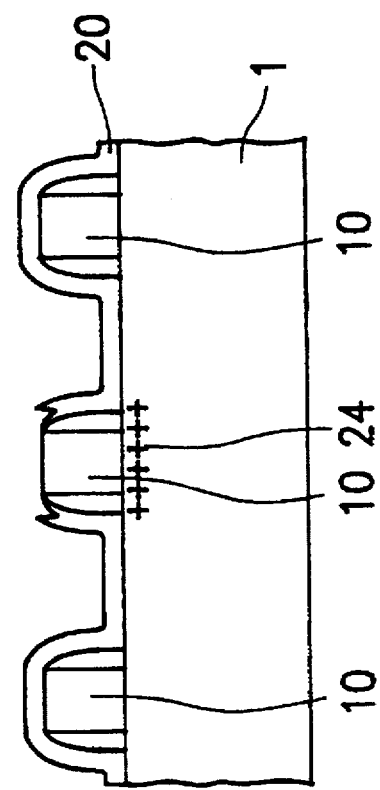

Then, as is seen in FIG. 7, the substrate 1 is then subjected to a controlled etching procedure, utilizing the photomask layer 22 as the shielding mask, to remove the portion of the deposited layer 20 that is exposed beyond the shielding. Both the exposed deposited layer 20 on the gate configuration 10 of the device area in FIG. 7a and the deposited layer 20 on the graphical pattern of FIG. 7b are removed in the etching procedure. The deposited layer 20 serves to buffer the exposed gate configuration 10 of the programmed memory cell transistor in the etching procedure that is utilized to form the graphical pattern for the alphanumeric code markings. For this purpose, the thickness should not be too small, but should be within the range of about 200–2,000 angstroms as described above.

Finally, as is shown in FIG. 8, the photomask layer 22 may then be removed for the post procedural steps to fabricate the mask ROM device. The alphanumeric code marking in FIG. 8b is then defined over the substrate 1 by the layer of the deposited layer 20.

FIGS. 9 to 12 are the cross-sectional views of the memory device and the alphanumeric markings of the memory cell unit of a mask ROM device, as selected from the procedural stages in the process of fabrication in accordance with a second preferred embodiment of the present invention. This second embodiment of the present invention differs from the first one described above only in that the etch-forming procedure for the alphanumeric code marking precedes, rather than follows the code implant procedure.

Thus, the process for making identification alphanumeric code markings for mask ROM devices of the present invention features simplified process steps when compared with the prior art process. At least one photomasking procedure is eliminated to achieve a simpler mask ROM device fabrication process.

As persons skilled in this art may well appreciate, the above description of the preferred embodiments of the present invention is employed for the purpose of description, not to restrict the scope of the present invention. Modifications to the outlined embodiments of the present invention may be apparent and should be considered to be within the scope of the present invention that is recited in the claims that follow.

What is claimed is:

1. A process for fabricating identification alphanumeric code markings on a substrate of mask ROM devices comprising the steps of:

(a) forming a deposited layer on said substrate;

(b) forming a photoresist layer over said deposited layer;

(c) forming a photomask layer by forming a pattern in said photoresist layer revealing channel regions of memory cell transistors to be programmed and revealing a graphical pattern of said alphanumeric code marking;

(d) implementing an etching procedure using the photomask layer as a shielding mask to remove a portion of said deposited layer revealing said graphical pattern of said alphanumeric code markings; and (e) removing said photomask layer.

2. The process for fabricating identification alphanumeric code markings of claim 1, further comprising a step of code implanting after said step (c) for programming said memory cell transistors to be programmed.

3. The process for fabricating identification alphanumeric code markings of claim 2, wherein said code implantating step implants P-type impurities as code implants to program said memory cell transistors.

4. The process for fabricating identification alphanumeric code markings of claim 1, further comprising a step of code implanting after said step (d) for programming said memory cell transistors to be programmed.

5. The process for fabricating identification alphanumeric code markings of claim 4, wherein said code implantating step implants P-type impurities as code implants to program said memory cell transistors.

6. The process for fabricating identification alphanumeric code markings of claim 1, wherein said deposited layer is formed in an atmospheric pressure chemical vapor deposition procedure.

7. The process for fabricating identification alphanumeric code markings of claim 1, wherein said deposited layer is formed in a low-pressure chemical vapor deposition procedure.

8. The process for fabricating identification alphanumeric code markings of claim 1, wherein the thickness of said deposited layer is between 200 and 2,000 angstroms.

* * * * *